United States Patent [19]
Koch et al.

[11] Patent Number: 5,202,560
[45] Date of Patent: Apr. 13, 1993

[54] SYSTEM FOR MEASURING THE CONCENTRATION OF A GASEOUS COMPONENT BY DETECTING POSITIONS OF MODE JUMPS IN A LASER DIODE

[75] Inventors: Edmund Koch, Lübeck; Jens-Uwe Hagenah; Christoph Maurer, both of Bad Schwartau; Ulrich Heim, Lübeck; Wilfried Diekmann, Lübeck; Johann Otten, Bad Schwartau, all of Fed. Rep. of Germany

[73] Assignee: Drägerwerk Aktiengesellschaft, Lübeck, Fed. Rep. of Germany

[21] Appl. No.: 904,676

[22] Filed: Jun. 26, 1992

[30] Foreign Application Priority Data

Jul. 8, 1991 [DE] Fed. Rep. of Germany ....... 4122572

[51] Int. Cl.$^5$ .............................................. H01J 7/24
[52] U.S. Cl. ..................................... 250/238; 356/435
[58] Field of Search ............... 250/238, 343, 344, 345; 356/432, 435, 437; 372/9, 29, 33, 20, 26, 34; 73/23.35, 23.37

[56] References Cited
U.S. PATENT DOCUMENTS 4,849,637 7/1989 Cerft et al. ........................ 250/343
5,159,411 10/1992 Hammerich et al. ............... 356/432

Primary Examiner—David C. Nelms
Assistant Examiner—Que T. Le
Attorney, Agent, or Firm—Walter Ottesen

[57] ABSTRACT

The invention is directed to a method of operating a laser diode in a measuring system for spectroscopically measuring the concentration of a gaseous component in a gas sample. This method is improved in that the mode jumps of the laser diode are easily recognized when adjusting the temperature-current operating point of the laser diode. An optical filter is placed in the beam path for adjusting the temperature-current operating point of the laser diode and, by changing the temperature T and the operating current I of the laser diode while simultaneously receiving the output signal supplied by an evaluation unit, the spectral positions of the mode jumps of the laser diode are determined which are included in the absorption lines of the gas sample. Thereafter, the temperature-current operating point is adjusted so that the distance of this operating point to the positions of the mode jumps is not less than a fixed spacing. The invention is also directed to a measuring system for spectroscopically measuring the concentration of a gaseous component in a gas sample.

4 Claims, 1 Drawing Sheet

SYSTEM FOR MEASURING THE CONCENTRATION OF A GASEOUS COMPONENT BY DETECTING POSITIONS OF MODE JUMPS IN A LASER DIODE

FIELD OF THE INVENTION

The invention relates to a method for operating a laser diode in a measuring system for carrying out spectroscopic measurements of the concentration of a gaseous component. The measuring system includes a thermostat unit for adjusting a temperature and a direct-voltage source for adjusting an operating current for the laser diode as well as a detector unit for receiving the measurement signals of the radiation of the laser diode transmitted through the gaseous sample and an evaluation circuit. The invention also relates to a measuring system for spectroscopically measuring the concentration of a gaseous component in a gas sample.

BACKGROUND OF THE INVENTION

An arrangement having a laser diode for spectroscopic measurements of the concentration of a gaseous component is disclosed in the paper of M. Kroll et al entitled "Measurement of gaseous oxygen using diode laser spectroscopy" published in the Applied Physics Letters 51 (18), Nov. 2, 1987, pages 1465 to 1467. The method disclosed here relates to the gas spectroscopic measurement of oxygen concentrations on the basis of the radiation absorption in the wavelength range of approximately 760 nanometers. A laser diode of type ML-4405 having a monitor diode is used as the radiation source in the wavelength range of 759 to 764 nanometers. The laser diode is supplied by a control current comprising a direct-current component and an alternating-current component having a frequency of 5 KHz. The operating current I of the laser diode is adjusted with the direct-current component; whereas, the alternating-current component effects a periodic detuning in the region of the absorption lines. An alternating current having a sinusoidal curve trace is selected in order to provide a drive of the laser diode which is as free as possible of harmonics. The laser diode and the monitor diode are mounted as a block on a thermostat unit. By adjusting the temperature of the block, the laser diode is brought to one of the known absorption lines of oxygen. The operating point lies within the absorption line and is usually on the mean extreme value of the second derivative of the absorption line.

After passing through the gas to be investigated, the radiation emitted by the laser diode impinges upon a detector unit which is connected to an evaluation circuit. The evaluation circuit comprises essentially a lock-in amplifier having a signal input and a reference input. The measuring signal of the detector unit is applied to the signal input of this amplifier while a signal voltage having twice the frequency of the drive of the laser diode is applied to the reference input. The evaluation circuit further comprises a difference amplifier which likewise is connected to receive the measuring signal of the detector unit and to receive a signal from the monitor diode which is proportional to the radiation energy. The output voltage of the difference amplifier corresponds to the absorption line for the measured oxygen concentration. Since the absorption line is weakly pronounced especially for oxygen, the second derivative of the absorption line is used for the concentration measurement and corresponds to the output signal of the lock-in amplifier. The maximum amplitude of the output signal of the lock-in amplifier is approximately proportional to the partial pressure of the oxygen.

It is a disadvantage in the known arrangement that the laser diode can change the longitudinal mode when there is a change of the temperature T of the thermostat unit, a change of the operating current I and especially when there is a change because of deterioration processes associated with aging. This change in longitudinal mode causes a sudden frequency jump called mode jump. When manufacturing arrangements of this kind, mode jumps of the kind referred to above can be detected with an appropriate spectrometer and the operating point of the laser diode can be correspondingly adjusted. An adjustment of this kind can be carried out during the operating time only with a very substantial effort with respect to time and cost since the arrangement must then be connected to an appropriate spectrometer with which the spectrum of the laser diode can be recorded.

The paper of D. M. Bruce et al entitled "Detection of oxygen using short external cavity GaAs semiconductor diode lasers" published in Applied Optics, Volume 29, Number 9, Mar. 20, 1990, pages 1327 to 1332, discloses an arrangement wherein the mode jumps of the laser diode can be suppressed by means of an additional resonator which can be changed in length.

It is disadvantageous in this known arrangement that its realization is complex and requires a resonator as an additional component which disadvantageously affects the cost of the arrangement.

SUMMARY OF THE INVENTION

It is an object of the invention to provide a method for operating a laser diode which is improved in that the mode jumps of the laser diode are simple to detect when adjusting the temperature-current operating point thereof. Furthermore, the detection of the positions of the mode jumps should also be possible during operation. It is also an object of the invention to provide a measuring system wherein the method of the invention is carried out.

The method of the invention is for operating a laser diode in a measuring system for spectroscopically measuring the concentration of a gas component in a gas sample. The gas component has absorption lines and the measuring system includes: laser diode means for generating laser radiation and transmitting the radiation along a beam path through the gas sample; the laser diode means including a laser diode subject to mode jumps defining spectral positions and being operable by an operating current I and having a temperature-current operating point; a thermostat unit operatively connected to the laser diode for adjusting the temperature T of the laser diode; direct-voltage source means for supplying an operating current I to the laser diode; detector means for receiving the radiation passed through the gas sample and supplying a detector signal in dependence upon the detected radiation; an optical filter mounted in the beam path; evaluation circuit means for receiving the detector signal and supplying an output signal. The method includes the steps of: adjusting the temperature T and/or the operating current I while simultaneously monitoring the output signal to permit the spectral positions of the mode jumps to be determined which encompass the absorption lines of the gas component; and, then adjusting the temperature-current operating point of the laser diode so as to locate the operating point not to be less than a fixed spacing apart from the positions of the mode jumps in the region of the absorption lines.

The advantage of the method is essentially seen in that first an optical filter is placed in the beam path between the laser diode and the detector unit. This optical filter influences the transmission of the radiation in the range of the wavelength of the laser diode. The filter converts frequency changes of the laser diode into intensity changes at the detector unit. If the temperature T of the laser diode is changed by means of the thermostat unit, a low variation of the intensity at the detector unit is obtained for constant operating current I. However, if a mode jump (that is a frequency jump) occurs then a clear intensity change becomes manifest at the detector unit even though the output intensity of the laser diode has not changed substantially. This change can also be especially well detected from the derivatives of the measuring signal.

If the second derivative of the measuring signal is considered as it is supplied as the output signal of a lock-in amplifier, then a mode jump can be detected on the output signal by two sequential extreme values similar to the derivative of a Gaussian curve. An absorption line distinguishes from this curve trace qualitatively in that the absorption line has three interconnected extreme values. Frequency changes and mode jumps of the laser diode take place even for changes of the operating current I and with constant temperature T. After determining the mode jumps in the range of the absorption lines because of variation of the temperature T and/or of the operating current I, the temperature-current operating point of the laser diode is so adjusted from a combination of the temperature T and the operating current I that this operating point does not become nearer than a fixed spacing to the positions of the mode jumps. Here, the effect is utilized that the wavelength of the mode jumps of a laser diode is influenced differently by temperature and operating current.

It is advantageous to configure the optical filter as a cut-off or cut-on filter. Different types of filters can be used to carry out the method of the invention. These filters can be utilized in transmission as well as in reflection. Interference filters are just as suitable as colored glass. Other materials having a transmission change in the desired range such as plastics, semiconductors or glass are suitable. The filter can be freely mounted in the beam path or can be provided as an optical window on the measuring cuvette. The filter furthermore causes disturbing reflections in the beam path to be suppressed and thereby results in an improved signal-to-noise ratio.

The magnitude of the swing of the measuring signal can be influenced by the slope of the filter characteristic. A flat characteristic of the filter characteristic curve has been shown to be advantageous in experiments. In order to reduce signal distortions caused by the filter characteristic to a minimum, a filter having such a filter characteristic should be selected at which the range of the inflection point of the filter characteristic lies in the frequency variation of the laser diode.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
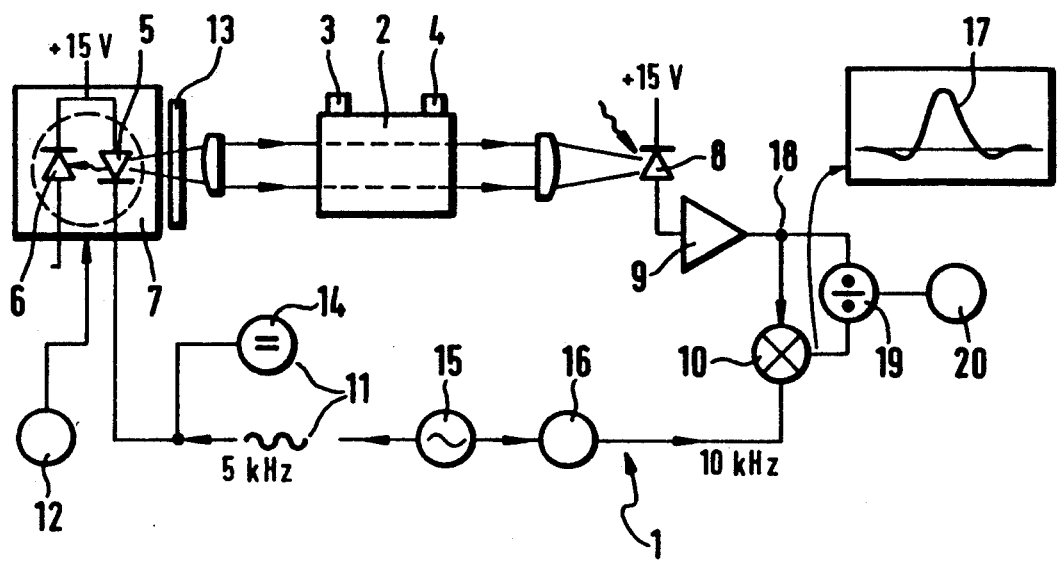
FIG. 1 is a schematic of an embodiment of a measuring system of the invention for the gaseous-spectroscopic measurement of the concentration of a gaseous component; and, FIG. 2 is a curve which shows the dependency of the output signal of the lock-in amplifier on the temperature T of the laser diode.

FIG. 1 shows a measuring system 1 for the gaseous-spectroscopic measurement of the concentration of oxygen in a gas sample. The gas sample is disposed in a measuring cuvette 2 and the gas sample flows through the cuvette from an inlet 3 of the cuvette to an outlet 4 thereof. The measuring cuvette 2 is irradiated by a laser diode 5 having a cut-off filter mounted downstream of the laser diode. The laser diode 5 and a monitor diode 6 are mounted on a thermostat unit 7. The temperature T of the thermostat unit 7 and therefore the temperature T of the laser diode 5 is adjustable by means of a temperature control unit 12. The radiation passing from the cuvette 2 impinges upon a detector unit 8 and the measuring signal generated at the detector unit is supplied via an amplifier 9 to a lock-in amplifier 10 which is configured as an evaluation circuit. The drive of the laser diode 5 takes place via a modulation profile 11 comprising a direct voltage made up of a direct-voltage source 14 and a sinusoidally-shaped alternating voltage having a frequency of 5 KHz. The alternating voltage is generated in a generator 15. An operating current I for the laser diode 5 is adjusted with the direct-voltage source 14.

The sinusoidally-shaped alternating voltage of the generator 15 is conducted through a frequency doubler 16 and is then supplied to the lock-in amplifier 10. The output signal 17 of the lock-in amplifier 10 corresponds to the second derivative of the absorption signal for the oxygen concentration in the gas sample. The output signal 17 and the signal at the measuring point 18 are connected to a divider 19 which, in turn, is connected to a display unit 20 for the oxygen concentration. A normalization is achieved with the divider 19 in such a manner that intensity losses of the radiation are compensated. These intensity losses can, for example, be attributed to the contamination of the measuring cuvette 2.

Figure 2:
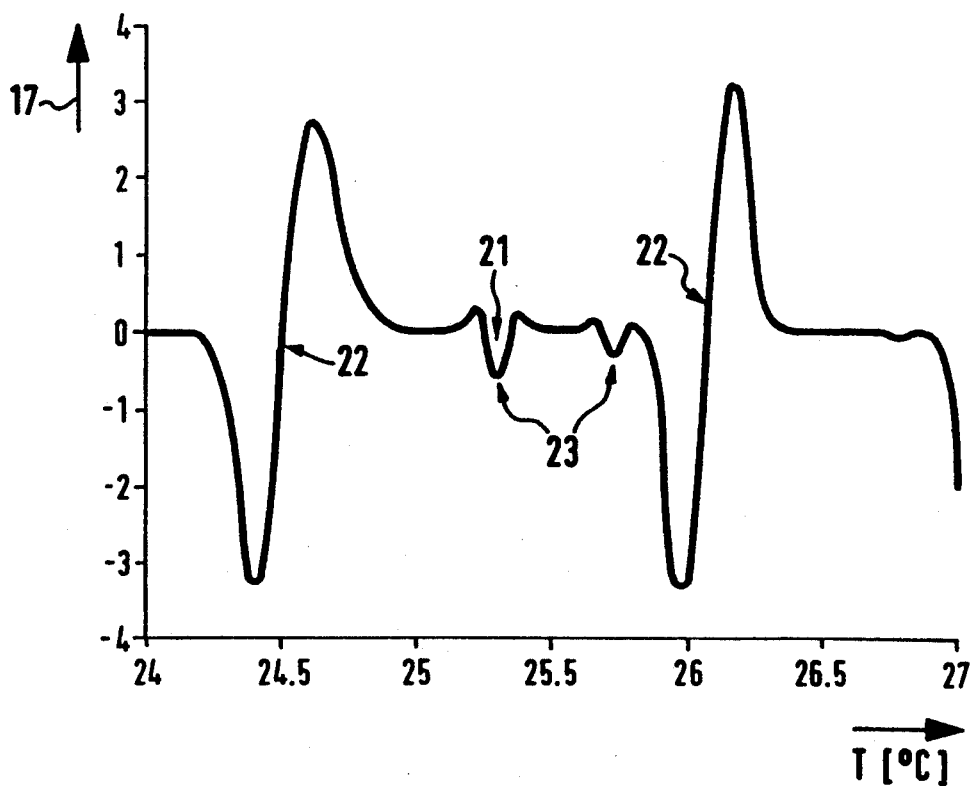

FIG. 2 shows qualitatively the dependence of the output signal 17 of the lock-in amplifier 10 on the temperature T of the laser diode 5. A temperature range from 24° to 27° C. is plotted on the abscissa while the ordinate has a scale for the magnitude of the output signal 17 which scale is without dimension. The curve trace of the output signal 17 as shown in FIG. 2 results when there is a variation of the temperature T by means of the temperature control unit 12 for constant operating current I. The positions of two sequential extreme values are the mode jumps 22 of the laser diode 5 and the positions having three sequential extreme values are the absorption lines 23 for the gas component to be detected. For determining the mode jumps, the dependence of the output signal 17 on the temperature T is first determined at fixed operating current I. Possibly further measurements must be carried out, for example, at constant I because the spacing between the absorption lines 23 and the positions of the mode jumps is influenced by the operating current I and the temperature T. From the resulting output signals 17, a combination of temperature T and operating current I is adjusted as a temperature-current operating point 21 of the laser diode for the steady-state operation for which the frequency of the laser diode 5 lies in the range of the absorption lines 23 and there is no drop below a fixed spacing to the positions of the mode jumps 22.

With the method of the invention, it is possible to fix a suitable temperature-current operating point 21 for the laser diode 5 even without a spectrometer. This temperature-operating point 21 is at an adequate spacing from the positions of the mode jumps 22.

It is understood that the foregoing description is that of the preferred embodiments of the invention and that various changes and modifications may be made thereto without departing from the spirit and scope of the invention as defined in the appended claims.

What is claimed is:

1. A measuring system for spectroscopically measuring the concentration of a gas component in a gas sample, the gas component having absorption lines, the measuring system comprising:
    laser diode means for generating laser radiation and transmitting said radiation along a beam path through the gas sample;
    said laser diode means including a laser diode subject to mode jumps defining spectral positions and being operable by an operating current I and having a temperature-current operating point;
    a thermostat unit operatively connected to said laser diode for adjusting the temperature T of said laser diode;
    direct-voltage source means for supplying an operating current I to said laser diode;
    detector means for receiving the radiation passed through said gas sample and supplying a detector signal in dependence upon the detected radiation;
    an optical filter mounted in said beam path;
    evaluation circuit means for receiving said detector signal and supplying an output signal;
    control means for adjusting said temperature T and/or said operating current I of said laser diode while monitoring said output signal so as to permit the spectral positions of said mode jumps to be determined which encompass said absorption lines; and,
    said control means being adapted to thereafter adjust the temperature-current operating point of said laser diode so as to locate the distance of said operating point not to be less than a fixed spacing apart from the positions of said mode jumps in the region of said absorption lines.

2. The measuring system of claim 1, said optical filter being a cut-off or cut-on filter.

3. The measuring system of claim 2, said cut-off or cut-on filter having a filter characteristic curve defining an inflection point, said filter characteristic curve being dimensioned so as to cause the frequency variation of the laser diode to lie in the range of said inflection point.

4. In a measuring system for spectroscopically measuring the concentration of a gas component in a gas sample, the gas component having absorption lines, the measuring system including: laser diode means for generating laser radiation and transmitting said radiation along a beam path through the gas sample; said laser diode means including a laser diode subject to mode jumps defining spectral positions and being operable by an operating current I and having a temperature-current operating point; a thermostat unit operatively connected to said laser diode for adjusting the temperature T of said laser diode; direct-voltage source means for supplying an operating current I to said laser diode; detector means for receiving the radiation passed through said gas sample and supplying a detector signal in dependence upon the detected radiation; an optical filter mounted in said beam path; evaluation circuit means for receiving said detector signal and supplying an output signal; and, control means for adjusting said temperature T and/or said operating current I of said laser diode; a method for operating said laser diode, the method comprising the steps of:
    adjusting the temperature T and/or said operating current I while simultaneously monitoring said output signal to permit said spectral positions of said mode jumps to be determined which encompass said absorption lines of said gas component; and,
    then adjusting the temperature-current operating point of said laser diode so as to locate the distance of said operating point not to be less than a fixed spacing apart from the positions of said mode jumps in the region of said absorption lines.

* * * * *

UNITED STATES PATENT AND TRADEMARK OFFICE
CERTIFICATE OF CORRECTION

PATENT NO. : 5,202,560

DATED : April 13, 1993

INVENTOR(S) : Edmund Koch, Jens-Uwe Hagenah, Christoph Maurer, Ulrich Heim, Wilfried Diekmann and Johann Otten It is certified that error appears in the above-identified patent and that said Letters Patent is hereby corrected as shown below:

In column 4, line 63: between "constant" and "I", please insert -- temperature T and with variations of the operating current --.

Signed and Sealed this

Thirtieth Day of November, 1993

Attest:

BRUCE LEHMAN

Attesting Officer

Commissioner of Patents and Trademarks